US012719460B2

(12) United States Patent
Kim et al.

(10) Patent No.: US 12,719,460 B2
(45) Date of Patent: Aug. 25, 2026

(54) TRANSMISSION CIRCUIT WITH EQUALIZATION FUNCTION AND TRAINING SYSTEM INCLUDING THE SAME

(71) Applicant: SK hynix Inc., Icheon-si Gyeonggi-do (KR)

(72) Inventors: Gwan Woo Kim, Icheon-si Gyeonggi-do (KR); In Seok Kong, Icheon-si Gyeonggi-do (KR); Keun Seon Ahn, Icheon-si Gyeonggi-do (KR); Sung Hwa Ok, Icheon-si Gyeonggi-do (KR); Eun Ji Choi, Icheon-si Gyeonggi-do (KR); Jae Hyeong Hong, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 155 days.

(21) Appl. No.: 18/626,113

(22) Filed: Apr. 3, 2024

(65) Prior Publication Data

US 2025/0150066 A1 May 8, 2025

(30) Foreign Application Priority Data

Nov. 7, 2023 (KR) ........................ 10-2023-0152526

(51) Int. Cl.
*H03K 5/01* (2006.01)
*H03K 3/017* (2006.01)
*H03K 19/00* (2006.01)

(52) U.S. Cl.
CPC ............... *H03K 5/01* (2013.01); *H03K 3/017* (2013.01); *H03K 19/0005* (2013.01)

(58) Field of Classification Search
CPC ...... H03K 5/01; H03K 3/017; H03K 19/0005; H03K 19/01721; G11C 7/1057; G11C 7/1048; G11C 7/1084; G06F 3/061; H04L 25/0278
USPC ........................................................ 327/108
See application file for complete search history.

(56) References Cited

U.S. PATENT DOCUMENTS 7,227,382 B1 * 6/2007 Talbot ................. H04L 25/0278 326/87
9,337,807 B2 * 5/2016 Hollis .................... H03K 3/011
9,391,594 B2 * 7/2016 Jung ........................ H04L 25/00
9,461,634 B2 * 10/2016 Jung ........................ H03K 5/01
9,647,664 B2 * 5/2017 Lee .................... H03K 19/0185
11,190,188 B2 * 11/2021 Cho ..................... G11C 7/1057
2007/0194805 A1 * 8/2007 Kim .................. H03K 19/0005 326/30

(Continued)

FOREIGN PATENT DOCUMENTS

KR 102416392 B1 7/2022

*Primary Examiner* — Ryan Jager
(74) *Attorney, Agent, or Firm* — WILLIAM PARK & ASSOCIATES LTD.

(57) ABSTRACT

A transmission circuit includes a plurality of driving units coupled with an input/output pad. The transmission circuit performs a data transmission operation by selecting at least one main driving unit corresponding to a predetermined driving strength from among the plurality of driving units and performs an equalization operation by selecting at least one auxiliary driving unit from among remaining driving units excluding the main driving unit.

21 Claims, 10 Drawing Sheets

(56) References Cited

U.S. PATENT DOCUMENTS

| | | | | |
|---|---|---|---|---|
| 2008/0157811 | A1* | 7/2008 | Lee | H03K 17/6872<br>326/30 |
| 2008/0278192 | A1* | 11/2008 | Lee | H03K 19/0005<br>326/30 |
| 2014/0159769 | A1* | 6/2014 | Hong | G11C 7/1051<br>326/30 |
| 2015/0280692 | A1* | 10/2015 | Jung | H03K 3/015<br>327/109 |
| 2015/0341019 | A1* | 11/2015 | Jung | H04L 25/00<br>327/108 |
| 2016/0094202 | A1* | 3/2016 | Hollis | G11C 29/028<br>327/109 |
| 2017/0346466 | A1* | 11/2017 | Jung | H03K 19/20 |
| 2019/0139613 | A1* | 5/2019 | Shin | G11C 16/0483 |
| 2023/0370309 | A1* | 11/2023 | Moon | H04L 25/03885 |
| 2024/0275644 | A1* | 8/2024 | Hattori | H04L 25/02 |
| 2025/0150066 | A1* | 5/2025 | Kim | H03K 3/017 |

* cited by examiner

| PUEN_PRE<i> | EQEN_PRE<i> | TRM<i> | PUEN<i> | PUEQEN<i> | OPERATION |
|---|---|---|---|---|---|
| 0 | 0 | 0 | 0 | 0 | OFF |
| 1 | X | 0 | 1 | 0 | MAIN (TRANSMISSION) |
| 0 | 1 | 0 | 1 | 1 | AUXILIARY (EQUALIZATION) |
| X | X | 1 | 1 | 1 | TRAINING MODE |

| | 600Ω | 300Ω | 150Ω | 120Ω |
|---|---|---|---|---|
| LTT 150 | A | M | A | Adft |
| LTT 100 | M | M | A | Adft |
| LTT 75 | A | A | M | Adft |
| LTT 50 | A | M | M | Adft |

TRANSMISSION CIRCUIT WITH EQUALIZATION FUNCTION AND TRAINING SYSTEM INCLUDING THE SAME

CROSS-REFERENCES TO RELATED APPLICATION

The present application claims priority under 35 U.S.C. § 119 (a) to Korean application number 10-2023-0152526 filed on Nov. 7, 2023, in the Korean Intellectual Property Office, which application is incorporated herein by reference in its entirety.

BACKGROUND

1. Technical Field

Various embodiments generally relate to a semiconductor circuit, and, more particularly, to a transmission circuit with equalization function and a training system including the same.

2. Related Art

Semiconductor apparatuses perform a termination operation for impedance matching with the outside. Semiconductor apparatuses perform termination in one of the following ways: Center-Tapped Termination (CTT), Low-Tapped Termination (LTT), and High-Tapped Termination (HTT).

In semiconductor apparatuses, speed and power consumption are major factors in their performance, so Low-Tapped Termination is often used to satisfy high-speed and low-power operation.

However, as the Low-Tapped Termination method is applied, the ability to drive the transmitted signal is degraded, and eventually the quality of the transmitted signal is degraded.

SUMMARY

In an embodiment, a transmission circuit may include a plurality of driving units coupled with an input/output pad. The transmission circuit may be configured to perform a data transmission operation by selecting at least one main driving unit corresponding to a predetermined driving strength from among the plurality of driving units and may be configured to perform an equalization operation by selecting at least one auxiliary driving unit from among remaining driving units excluding the main driving unit.

In an embodiment, a transmission circuit may include a data driver, a driving strength and equalization control circuit, and a pre-driver. The data driver may include a plurality of driving units having different driving strengths and coupled to an input/output pad, and may be configured to select at least one of the plurality of driving units as a main driving unit and at least one other than the at least one as an auxiliary driving unit in response to a first impedance control signal. The driving strength and equalization control circuit may be configured to generate a plurality of main/auxiliary selection signals in response to a plurality of strength control signals, a plurality of equalization control signals, and input data. The pre-driver may be configured to output a result of a logical combination of the plurality of main/auxiliary selection signals and a first impedance adjustment signal as the first impedance control signal.

In an embodiment, a training system may include a semiconductor apparatus and a host. The semiconductor apparatus may include a plurality of driving units coupled with an input/output pad. The semiconductor apparatus may be configured to perform a data transmission operation by selecting at least one main driving unit corresponding to a predetermined driving strength from among the plurality of driving units and may be configured to perform an equalization operation by selecting at least one auxiliary driving unit from among remaining driving units excluding the main driving unit. The host may be configured to write the semiconductor apparatus with write data having a predetermined pattern and may be configured to perform a training operation by changing the auxiliary driving unit among the plurality of driving units according to read data.

DETAILED DESCRIPTION

Hereinafter, some embodiments will be described in more detail with reference to the accompanying drawings.

Figure 1:
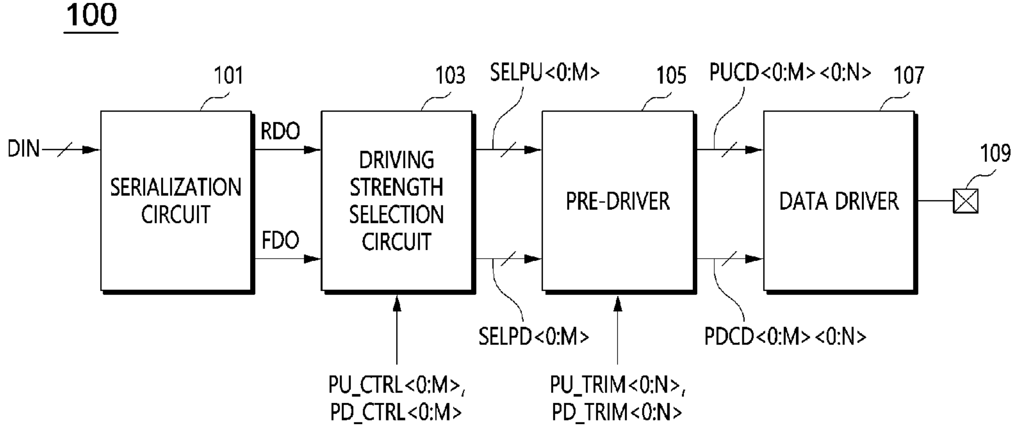
FIG. 1 is a diagram illustrating a configuration of a transmission circuit according to an embodiment.

FIG. 1 is a diagram illustrating a configuration of a transmission circuit 100 according to an embodiment.

Referring to FIG. 1, the transmission circuit 100 may include a serialization circuit 101, a driving strength selection circuit 103, a pre-driver 105, and a data driver 107.

The serialization circuit 101 may receive parallel data DIN as input and output pull-up data RDO and pull-down data FDO. The serialization circuit 101 may be configured to serialize the parallel data DIN to generate serial data, i.e., pull-up data RDO and pull-down data FDO.

The driving strength selection circuit 103 may receive the pull-up data RDO, the pull-down data FDO, and a plurality of pre-selection signals PU_CTRL<0:M> and PD_CTRL<0:M> as input and output a plurality of pull-up selection signals SELPU<0:M> and a plurality of pull-down selection signals SELPD<0:M>.

The pre-driver 105 may receive the plurality of pull-up selection signals SELPU<0:M>, the plurality of pull-down selection signals SELPD<0:M>, a first impedance adjustment signal PU_TRIM<0:N>, and a second impedance adjustment signal PD_TRIM<0:N>, and may output a plurality of first impedance control signals PUCD<0:M><0:N> and a plurality of second impedance control signals PDCD<0:M><0:N>. The first impedance adjustment signal PU_TRIM<0:N> and the second impedance adjustment signal PD_TRIM<0:N> may be generated in an impedance matching circuit (not shown) in a semiconductor apparatus including the transmission circuit 100 according to an embodiment. The impedance matching circuit may adjust values of the first impedance adjustment signal PU_TRIM<0:N> and the second impedance adjustment signal PD_TRIM<0:N> to match a predetermined driving impedance based on a resistance value of an external resistor coupled with an external resistance pad of the semiconductor apparatus.

The data driver 107 may have an output terminal coupled to an input/output pad 109. The data driver 107 may drive the input/output pad 109 according to the plurality of first impedance control signals PUCD<0:M><0:N> and the plurality of second impedance control signals PDCD<0:M><0:N>.

Figure 2:
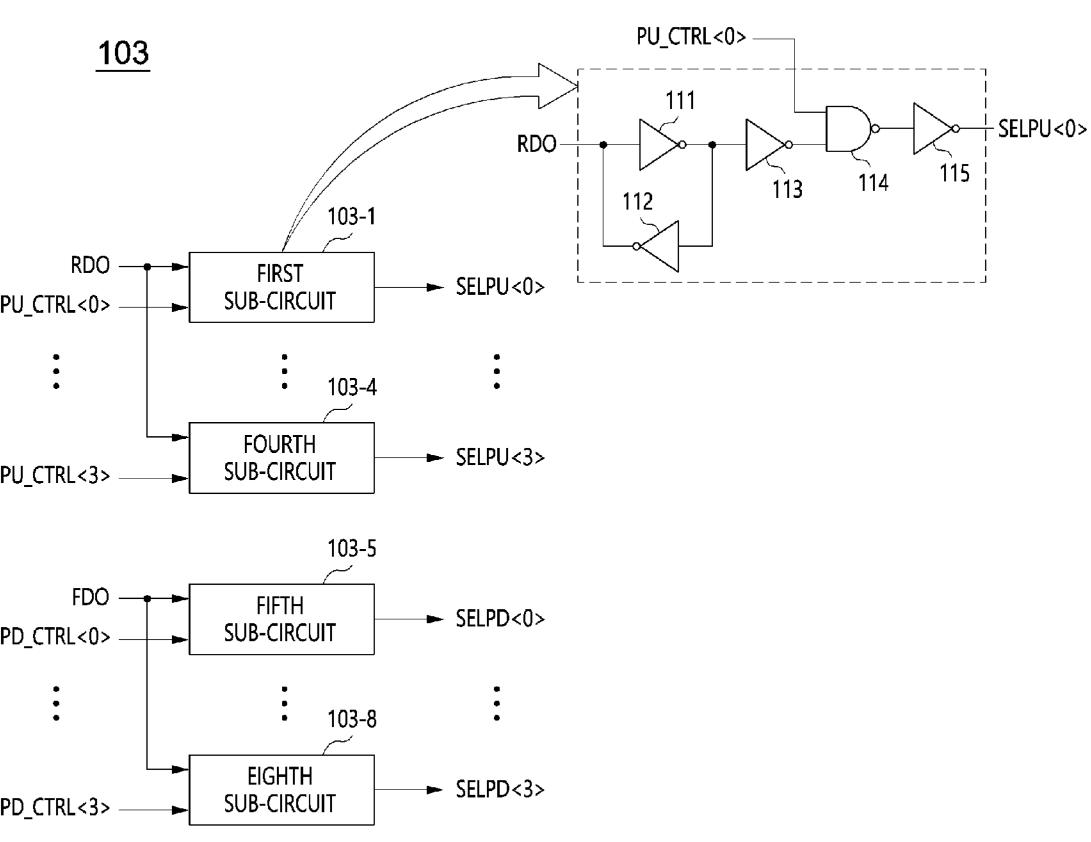
FIG. 2 is a diagram illustrating a configuration of a driving strength selection circuit of FIG. 1 according to an embodiment.

FIG. 2 is a diagram illustrating a configuration of the driving strength selection circuit 103 of FIG. 1 according to an embodiment.

Referring to FIG. 2, the driving strength selection circuit 103 may include a plurality of sub-circuits 103-1 to 103-8.

A first sub-circuit 103-1 may receive pull-up data RDO and a pre-selection signal PU_CTRL<0> and generate a pull-up selection signal SELPU<0>. A second sub-circuit 103-2 may receive the pull-up data RDO and a pre-selection signal PU_CTRL<1> and generate a pull-up selection signal SELPU<1>. A third sub-circuit 103-3 may receive the pull-up data RDO and a pre-selection signal PU_CTRL<2> and generate a pull-up selection signal SELPU<2>. A fourth sub-circuit 103-4 may receive the pull-up data RDO and a pre-selection signal PU_CTRL<3> and generate a pull-up selection signal SELPU<3>.

A fifth sub-circuit 103-5 may receive the pull-down data FDO and a pre-selection signal PD_CTRL<0> and generate a pull-down selection signal SELPD<0>. A sixth sub-circuit 103-6 may receive the pull-down data FDO and a pre-selection signal PD_CTRL<1> and generate a pull-down selection signal SELPD<1>. A seventh sub-circuit 103-7 may receive the pull-down data FDO and a pre-selection signal PD_CTRL<2> and generate a pull-down selection signal SELPD<2>. An eighth sub-circuit 103-8 may receive the pull-down data FDO and a pre-selection signal PD_CTRL<3> and generate a pull-down selection signal SELPD<3>.

The first sub-circuit 103-1 may include a plurality of logic gates 111 to 115. A first logic gate 111 and a second logic gate 112 may latch pull-up data RDO. A third logic gate 113 may invert and output an output of the first logic gate 111. A fourth logic gate 114 and a fifth logic gate 115 may output a result of performing AND operation on an output of the third logic gate 113 and the pre-selection signal PU_CTRL<0> as a pull-up selection signal SELPU<0>. The first sub-circuit 103-1 might output the pull-up data RDO as the pull-up selection signal SELPU<0> only when the pre-selection signal PU_CTRL<0> is activated to a high level, and may keep the pull-up selection signal SELPU<0> at a low level regardless of a level of the pull-up data RDO when the pre-selection signal PU_CTRL<0> is deactivated to a low level. The second sub-circuit 103-2 to the eighth sub-circuit 103-8 may have the same circuit configuration as the first sub-circuit 103-1.

Figure 3:
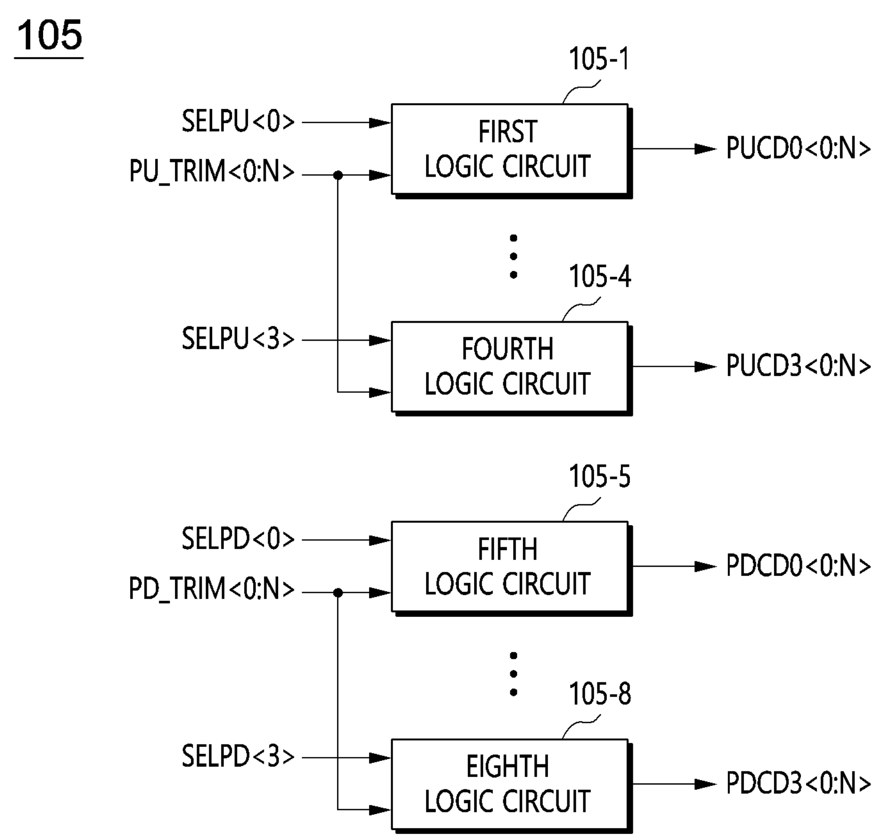
FIG. 3 is a diagram illustrating a configuration of a pre-driver of FIG. 1 according to an embodiment.

FIG. 3 is a diagram illustrating a configuration of the pre-driver 105 of FIG. 1 according to an embodiment.

Referring to FIG. 3, the pre-driver 105 may include a plurality of logic circuits 105-1 to 105-8.

The first logic circuit 105-1 may receive the pull-up selection signal SELPU<0> and the first impedance adjustment signal PU_TRIM<0:N> as input and output a first impedance control signal PUCD0<0:N>. The first logic circuit 105-1 may comprise logical product logic for performing AND operation on the pull-up selection signal SELPU<0> and the first impedance adjustment signal PU_TRIM<0:N> to output. The first logic circuit 105-1 may output the first impedance adjustment signal PU_TRIM<0:N> as the first impedance control signal PUCD0<0:N> when the pull-up selection signal SELPU<0> is activated to a high level.

The second logic circuit 105-2 may receive the pull-up selection signal SELPU<1> and the first impedance adjustment signal PU_TRIM<0:N> as input and output a first impedance control signal PUCD1<0:N>. The third logic circuit 105-3 may receive the pull-up selection signal SELPU<2> and the first impedance adjustment signal PU_TRIM<0:N> and output an impedance control signal PUCD2<0:N>. The fourth logic circuit 105-4 may receive the pull-up selection signal SELPU<3> and the first impedance adjustment signal PU_TRIM<0:N> and output the first impedance control signal PUCD3<0:N>. The second logic circuit 105-2 to the fourth logic circuit 105-4 may include the same logical product logic as the first logic circuit 105-1. The second logic circuit 105-2 to the fourth logic circuit 105-4 may output the first impedance control signal PUCD<1:3><0:N> corresponding to the first impedance adjustment signal PU_TRIM<0:N> when a signal corresponding to itself among the pull-up selection signals SELPU<1:3> is activated to a high level.

The fifth logic circuit 105-5 may receive the pull-down selection signal SELPD<0> and the second impedance adjustment signal PD_TRIM<0:N> as input and output a second impedance control signal PDCD0<0:N>. The fifth logic circuit 105-5 may comprise logical product logic for performing AND operation on the pull-down selection signal SELPD<0> and the second impedance adjustment signal PD_TRIM<0:N> to output. The fifth logic circuit 105-5 may output the second impedance adjustment signal PD_TRIM<0:N> as the second impedance control signal PDCD0<0:N> when the pull-down selection signal SELPD<0> is activated to a high level.

The sixth logic circuit 105-6 may receive a pull-down selection signal SELPD<1> and a second impedance adjustment signal PD_TRIM<0:N> as input and output a second impedance control signal PDCD1<0:N>. The seventh logic circuit 105-7 may receive a pull-down selection signal SELPD<2> and the second impedance adjustment signal PD_TRIM<0:N> and output a second impedance control signal PDCD2<0:N>. The eighth logic circuit 105-8 may receive a pull-down selection signal SELPD<3> and the second impedance adjustment signal PD_TRIM<0:N> and output a second impedance control signal PDCD3<0:N>.

The sixth logic circuit 105-6 to the eighth logic circuit 105-8 may include the same logical product logic as the fifth logic circuit 105-5. The sixth logic circuit 105-6 to the eighth logic circuit 105-8 may output the second impedance control signal PDCD<1:3><0:N> corresponding to the second impedance adjustment signal PD_TRIM<0:N> when a signal corresponding to itself among the pull-down selection signals SELPD<1:3> is activated to a high level.

Figure 4:
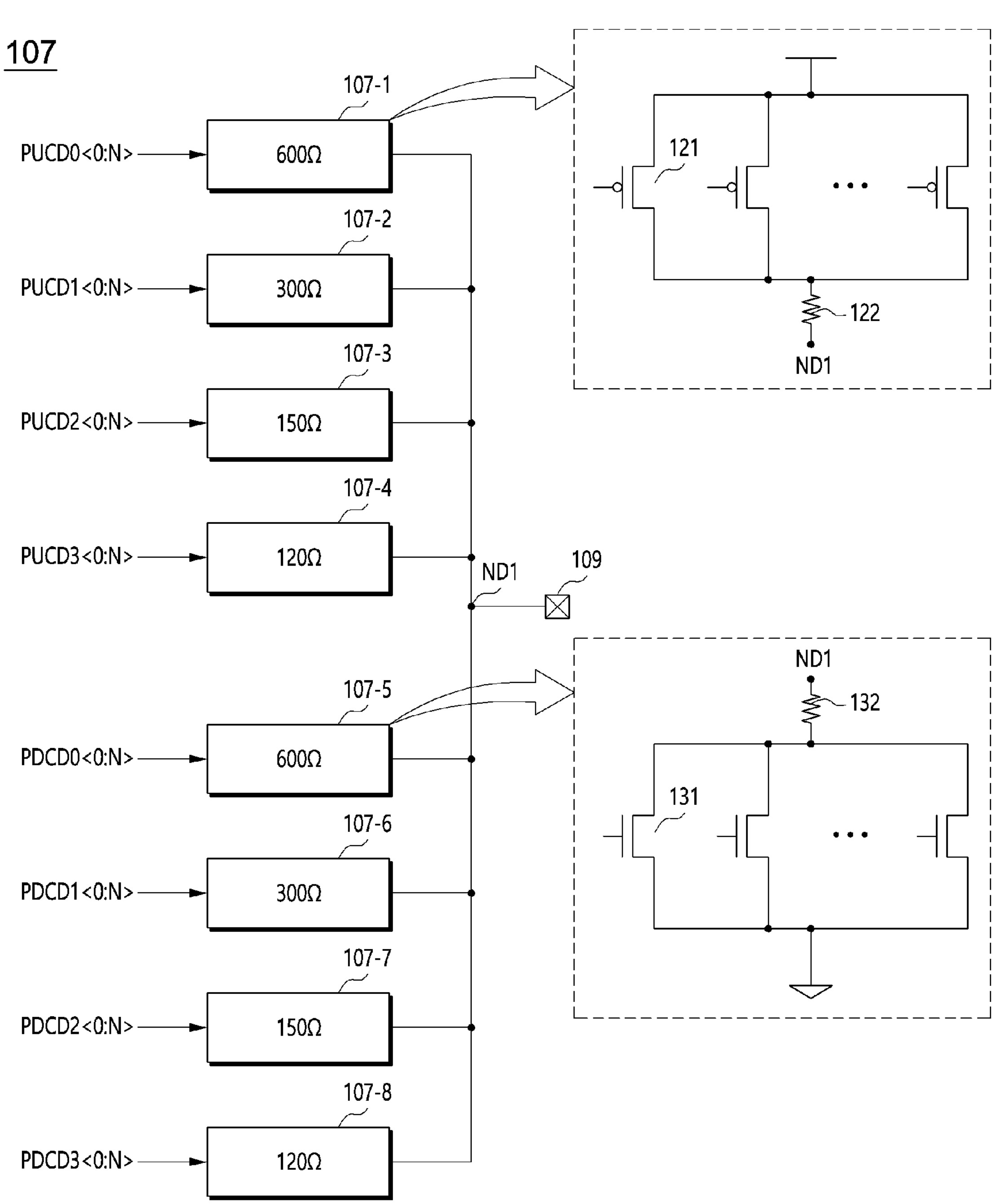
FIG. 4 is a diagram illustrating a configuration of a data driver of FIG. 1 according to an embodiment.

FIG. 4 is a diagram illustrating a configuration of the data driver 107 of FIG. 1 according to an embodiment.

Referring to FIG. 4, the data driver 107 may include a plurality of driving units, namely pull-up driving units 107-1 to 107-4 and pull-down driving units 107-5 to 107-8, in common connection with the input/output pad 109 through a node ND1.

The pull-up driving units 107-1 to 107-4 may be designed to have different driving strengths, i.e., different impedances, according to a plurality of first impedance control signals PUCD<0:3><0:N>. The first pull-up driving unit 107-1 may drive the input/output pad 109 with a first impedance set according to the first impedance control signal PUCD0<0:N>. The first impedance may be, for example, 600 ohms. The second pull-up driving unit 107-2 may drive the input/output pad 109 with a second impedance set according to the first impedance control signal PUCD1<0:N>. The second impedance may be, for example, 300 ohms. The third pull-up driving unit 107-3 may drive the input/output pad 109 with a third impedance set according to the first impedance control signal PUCD2<0:N>. The third impedance may be, for example, 150 ohms. The fourth pull-up driving unit 107-4 may drive the input/output pad 109 with a fourth impedance set according to the first impedance control signal PUCD3<0:N>. The fourth impedance may be, for example, 120 ohms.

Because the pull-up driving units 107-1 to 107-4 may have similar circuit configurations to one another, the configuration of the first pull-up driving unit 107-1 will be described by way of example. The first pull-up driving unit 107-1 may include a plurality of transistors 121 having sources coupled in common with a power terminal and a resistor 122 having a first end coupled with the node ND1 and a second end coupled in common with drains of the plurality of transistors 121. The first impedance control signal PUCD0<0:N> may be input so that one bit is applied at each gate of the plurality of transistors 121.

The pull-down driving units 107-5 to 107-8 may be designed to have different impedances according to the plurality of second impedance control signals PDCD<0:3><0:N>. The first pull-down driving unit 107-5 may drive the input/output pad 109 with a first impedance set according to the second impedance control signal PDCD0<0:N>. The second pull-down driving unit 107-6 may drive the input/output pad 109 with a second impedance set according to the second impedance control signal PDCD1<0:N>. The third pull-down driving unit 107-7 may drive the input/output pad 109 with a third impedance set according to the second impedance control signal PDCD2<0:N>. The fourth pull-down driving unit 107-8 can drive the input/output pad 109 with a fourth impedance set according to the second impedance control signal PDCD3<0:N>.

Because the pull-down driving units 107-5 to 107-8 may have similar circuit configurations to each other, the configuration of the first pull-down driving unit 107-5 will be described by way of example. The first pull-down driving unit 107-5 may include a plurality of transistors 131 having sources coupled in common with a ground terminal and a resistor 132 having a first end coupled with the node ND1 and a second end coupled in common with drains of the plurality of transistors 131. The second impedance control signal PDCD0<0:N> may be input so that one bit is applied at each gate of the plurality of transistors 131.

Figure 5:
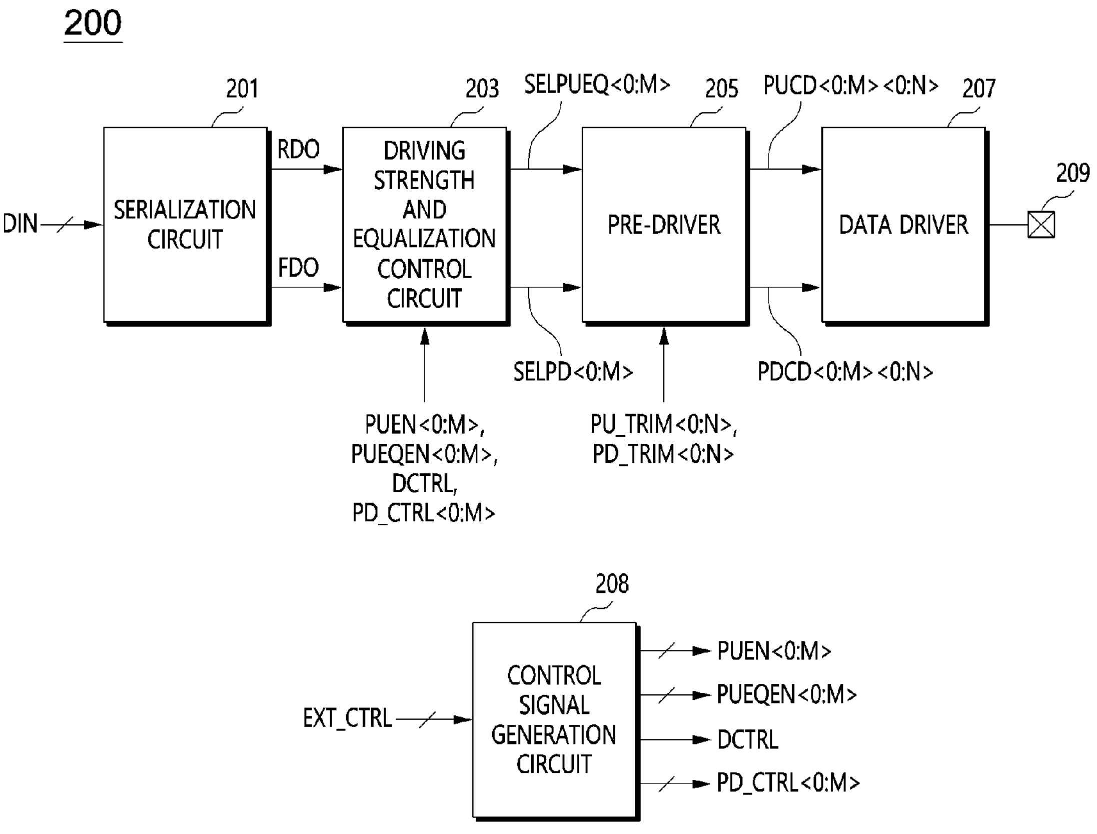
FIG. 5 is a diagram illustrating a configuration of a transmission circuit according to an embodiment.

FIG. 5 is a diagram illustrating a configuration of a transmission circuit 200 according to an embodiment.

The transmission circuit 200 may include a plurality of driving units coupled with one or more input/output pads, and may be configured to perform a data transmission operation by selecting at least one main driving unit corresponding to a predetermined driving strength from among the plurality of driving units, and may be configured to perform an equalization operation by selecting at least one auxiliary driving unit from among the remaining driving units excluding the main driving unit.

Referring to FIG. 5, the transmission circuit 200 may include a serialization circuit 201, a driving strength and equalization control circuit 203, a pre-driver 205, a data driver 207, and a control signal generation circuit 208.

The serialization circuit 201 may receive parallel data DIN as input and output pull-up data RDO and pull-down data FDO. The serialization circuit 201 may be configured to serialize the parallel data DIN to generate serial data, i.e., the pull-up data RDO and pull-down data FDO.

The driving strength and equalization control selection circuit 203 may be configured to receive the pull-up data RDO, the pull-down data FDO, a plurality of strength control signals PUEN<0:M>, a plurality of equalization control signals PUEQEN<0:M>, a plurality of pre-selection signals PD_CTRL<0:M>, and a delay control signal DCTRL, and may output a plurality of main/auxiliary selection signals SELPUEQ<0:M> and a plurality of pull-down selection signals SELPD<0:M>.

The pre-driver 205 may receive the plurality of main/auxiliary selection signals SELPUEQ<0:M>, the plurality of pull-down selection signals SELPD<0:M>, a first impedance adjustment signal PU_TRIM<0:N>, and a second impedance adjustment signal PD_TRIM<0:N>, and may output a plurality of first impedance control signals PUCD<0:M><0:N> and a plurality of second impedance control signals PDCD<0:M><0:N>. The first impedance adjustment signal PU_TRIM<0:N> and the second impedance adjustment signal PD_TRIM<0:N> may be generated in an impedance matching circuit (not shown) in a semiconductor apparatus including the transmission circuit 200 according to an embodiment. The impedance matching circuit may adjust values of the first impedance adjustment signal PU_TRIM<0:N> and the second impedance adjustment signal PD_TRIM<0:N> to match a predetermined driving impedance based on a resistance value of an external resistor coupled to an external resistance pad of the semiconductor apparatus.

The data driver 207 may have an output terminal coupled to an input/output pad 209. The data driver 207 may drive the input/output pad 209 according to the plurality of first impedance control signals PUCD<0:M><0:N> and the plurality of second impedance control signals PDCD<0:M><0:N>.

The control signal generation circuit 208 may generate the plurality of strength control signals PUEN<0:M>, the plurality of equalization control signals PUEQEN<0:M>, the second impedance adjustment signal PD_CTRL<0:M>, and the delay control signal DCTRL according to driving strength information and an external control signal EXT_CTRL.

Figure 6:
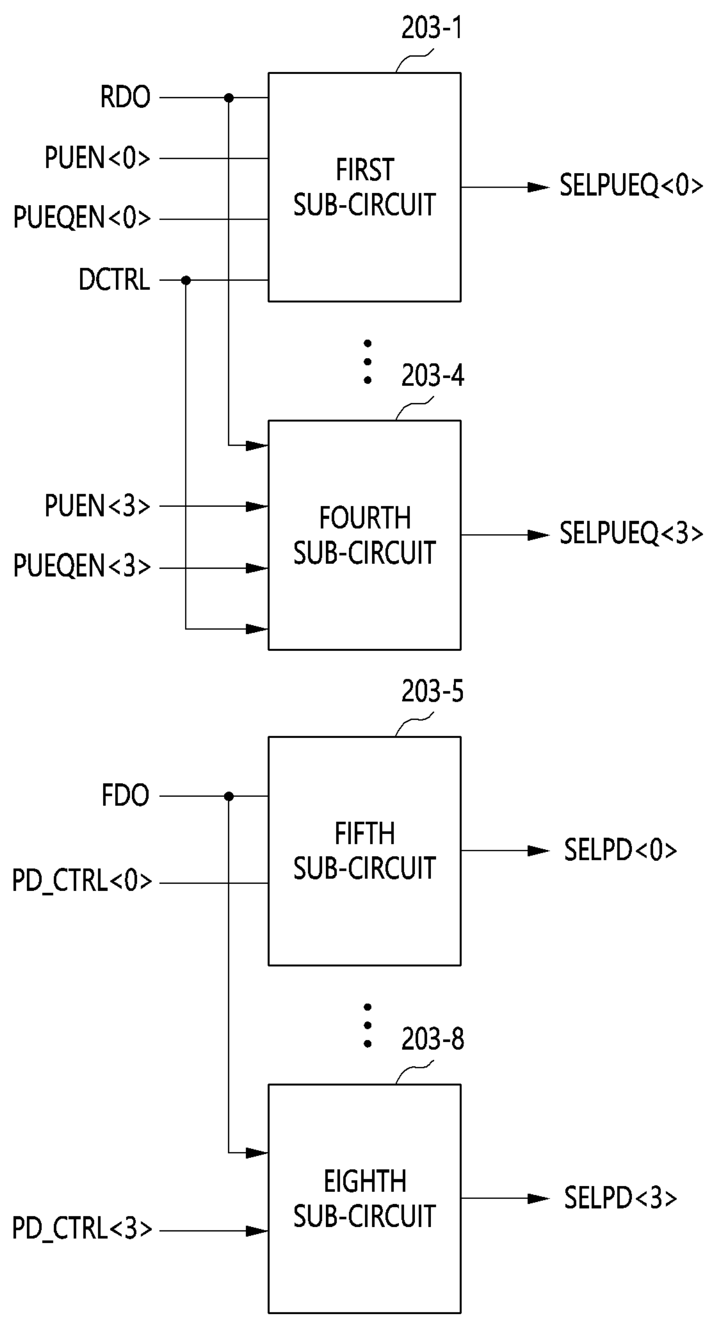
FIG. 6 is a diagram illustrating a configuration of a driving strength and equalization control circuit of FIG. 5 according to an embodiment.

FIG. 6 is a diagram illustrating a configuration of the driving strength and equalization control circuit 203 of FIG. 5 according to an embodiment.

Referring to FIG. 6, the driving strength and equalization control circuit 203 may include a plurality of sub-circuits 203-1 to 203-8.

A first sub-circuit 203-1 may receive the pull-up data RDO, a strength control signal PUEN<0>, an equalization control signal PUEQEN<0>, and the delay control signal DCTRL, and may output a main/auxiliary selection signal SELPUEQ<0>. The second sub-circuit 203-2 may receive the pull-up data RDO, a strength control signal PUEN<1>, an equalization control signal PUEQEN<1>, and the delay control signal DCTRL and output a main/auxiliary selection signal SELPUEQ<1>. The third sub-circuit 203-3 may receive the pull-up data RDO, a strength control signal PUEN<2>, an equalization control signal PUEQEN<2>, and the delay control signal DCTRL and output a main/auxiliary selection signal SELPUEQ<2>. The fourth sub-circuit 203-4 may receive the pull-up data RDO, a strength control signal PUEN<3>, an equalization control signal PUEQEN<3>, and the delay control signal DCTRL and output a main/auxiliary selection signal SELPUEQ<3>.

The fifth sub-circuit 203-5 may receive the pull-down data FDO and a pre-selection signal PD_CTRL<0> and generate a pull-down selection signal SELPD<0>. The sixth sub-circuit 203-6 may receive the pull-down data FDO and a pre-selection signal PD_CTRL<1> and generate a pull-down selection signal SELPD<1>. The seventh sub-circuit 203-7 may receive the pull-down data FDO and a pre-selection signal PD_CTRL<2> and generate a pull-down selection signal SELPD<2>. The eighth sub-circuit 203-8 may receive the pull-down data FDO and a pre-selection signal PD_CTRL<3> and generate a pull-down selection signal SELPD<3>.

Figure 7:
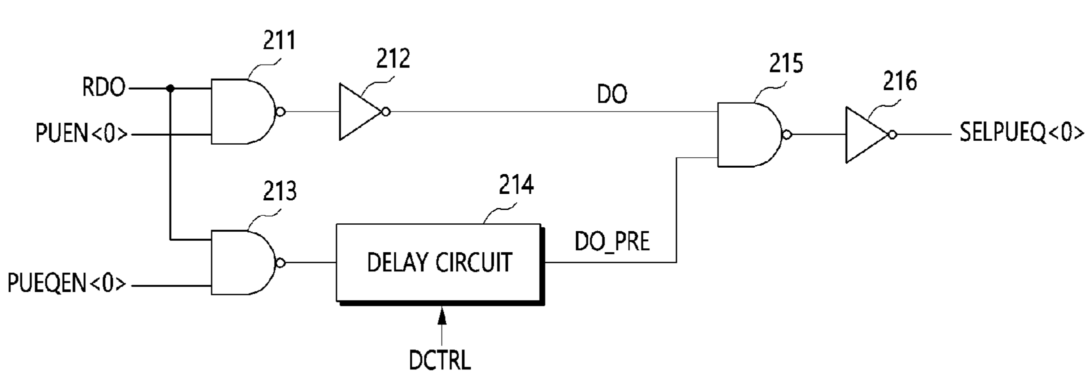
FIG. 7 is a diagram illustrating a configuration and operation of a first sub-circuit of FIG. 6 according to an embodiment.
Figure 7:
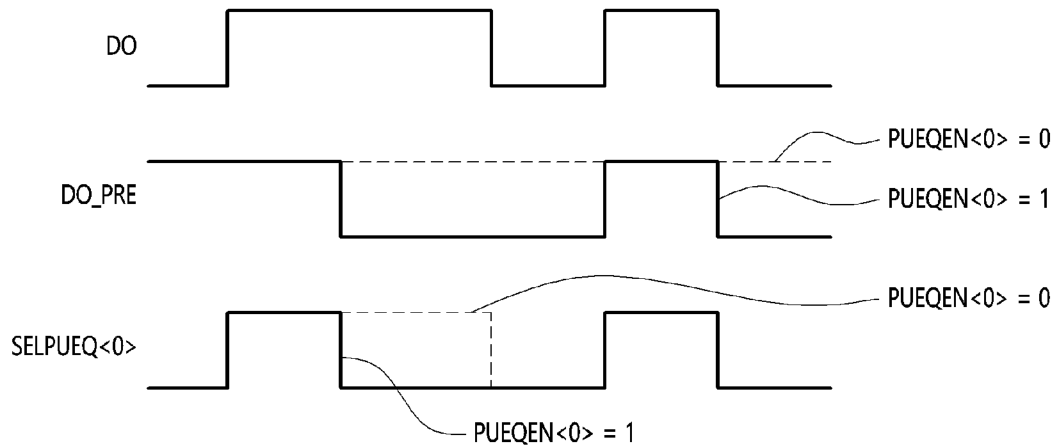

FIG. 7 is a diagram illustrating a configuration and operation of the first sub-circuit 203-1 of FIG. 6 according to an embodiment.

Referring to FIG. 7, the first sub-circuit 203-1 may include a plurality of logic gates 211, 212, 213, 215, 216, and a delay circuit 214.

A first logic gate 211 and a second logic gate 212 may perform AND operation on the pull-up data RDO and the strength control signal PUEN<0> to generate an output signal DO. A third logic gate 213 may perform NAND operation on the pull-up data RDO and the equalization control signal PUEQEN<0> and direct output to the delay circuit 214. The delay circuit 214 may delay the output of the third logic gate 213 by a delay time adjusted by the delay control signal DCTRL to generate an output signal DO_PRE. The delay circuit 214 generates the output signal DO_PRE by inverting and delaying a rising edge of the pull-up data RDO when the equalization control signal PUEQEN<0> is at a high level, and maintains the output signal DO_PRE at a high level regardless of transition of the pull-up data RDO when the equalization control signal PUEQEN<0> is at a low level. The fourth logic gate 215 and the fifth logic gate 216 may output a result of performing an AND operation on the output signal DO of the second logic gate 212 and the output signal DO_PRE of the delay circuit 214 as the main/auxiliary selection signal SELPUEQ<0>.

Figure 8:
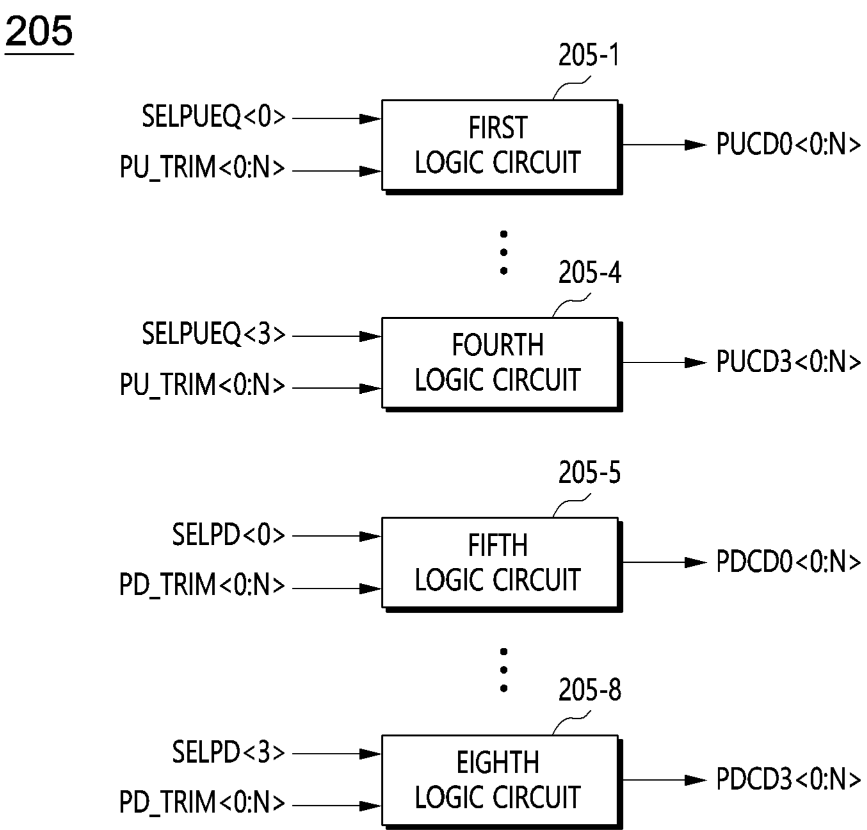
FIG. 8 is a diagram illustrating a configuration of a pre-driver of FIG. 5 according to an embodiment.

FIG. 8 is a diagram illustrating a configuration of the pre-driver 205 of FIG. 5 according to an embodiment.

Referring to FIG. 8, the pre-driver 205 may include a plurality of logic circuits 205-1 to 205-8.

A first logic circuit 205-1 may receive a main/auxiliary selection signal SELPUEQ<0> and the first impedance adjustment signal PU_TRIM<0:N> as input and output a first impedance control signal PUCD0<0:N>. A second logic circuit 205-2 may receive a main/auxiliary selection signal SELPUEQ<1> and the first impedance adjustment signal PU_TRIM<0:N> and output a first impedance control signal PUCD1<0:N>. A third logic circuit 205-3 may receive a main/auxiliary selection signal SELPUEQ<2> and the first impedance adjustment signal PU_TRIM<0:N> and output a first impedance control signal PUCD2<0:N>. A fourth logic circuit 205-4 may receive a main/auxiliary selection signal SELPUEQ<3> and the first impedance adjustment signal PU_TRIM<0:N> and output a first impedance control signal PUCD3<0:N>. A fifth logic circuit 205-5 may receive a pull-down selection signal SELPD<0> and the second impedance adjustment signal PD_TRIM<0:N> and output a second impedance control signal PDCD0<0:N>. A sixth logic circuit 205-6 may receive a pull-down selection signal SELPD<1> and the second impedance adjustment signal PD_TRIM<0:N> and output a second impedance control signal PDCD1<0:N>. A seventh logic circuit 205-7 may receive a pull-down selection signal SELPD<2> and the second impedance adjustment signal PD_TRIM<0:N> and output a second impedance control signal PDCD2<0:N>. An eighth logic circuit 205-8 may receive a pull-down selection signal SELPD<3> and the second impedance adjustment signal PD_TRIM<0:N> and output a second impedance control signal PDCD3<0:N>. The first to eighth logic circuits 205-1 to 205-8 may be configured as logical product logic for performing AND operation on the input signals and outputting them.

Figure 9:
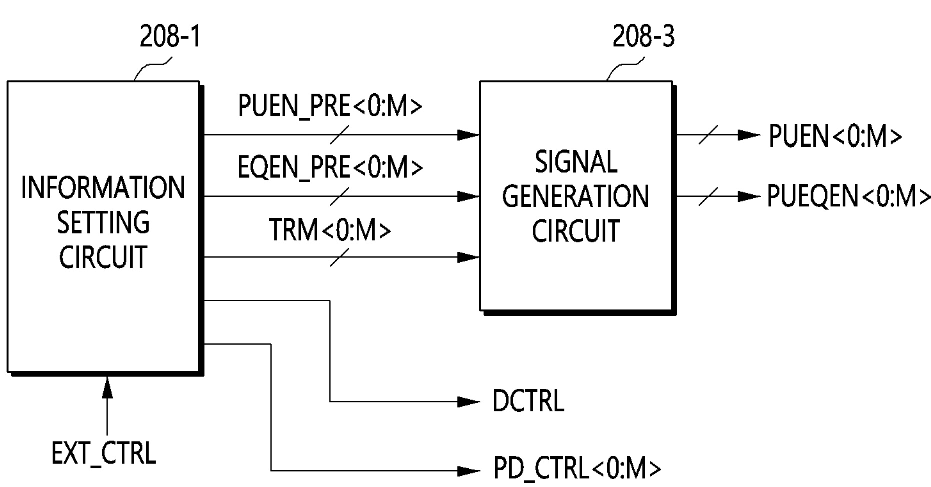
FIG. 9 is a diagram illustrating a configuration of a control signal generation circuit of FIG. 5 according to an embodiment.

FIG. 9 is a diagram illustrating a configuration of the control signal generation circuit 208 of FIG. 5 according to an embodiment.

Referring to FIG. 9, the control signal generation circuit 208 may include an information setting circuit 208-1 and a signal generation circuit 208-3.

The information setting circuit 208-1 may generate a plurality of preliminary strength control signals PUEN_PRE<0:M>, a plurality of pre-equalization control signals EQEN_PRE<0:M>, a plurality of pre-selection signals PD_CTRL<0:M>, and the delay control signal DCTRL for selecting a main driving unit suitable for performing a data transmission operation and an auxiliary driving unit suitable for performing an equalization operation from among the plurality of driving units 107-1 to 107-8 (see FIG. 4) according to a predetermined driving strength information. The information setting circuit 208-1 may adjust values of the plurality of preliminary strength control signals PUEN_PRE<0:M>, the plurality of pre-equalization control signals EQEN_PRE<0:M>, and the delay control signal DCTRL according to the external control signal EXT_CTRL, and generate a plurality of training mode control signals TRM<0:M>.

The signal generation circuit 208-3 may generate a plurality of strength control signals PUEN<0:M> and a plurality of equalization control signals PUEQEN<0:M> by combining the plurality of preliminary strength control signals PUEN_PRE<0:M>, the plurality of pre-equalization control signals EQEN_PRE<0:M>, and the plurality of training mode control signals TRM<0:M>.

Figure 10:
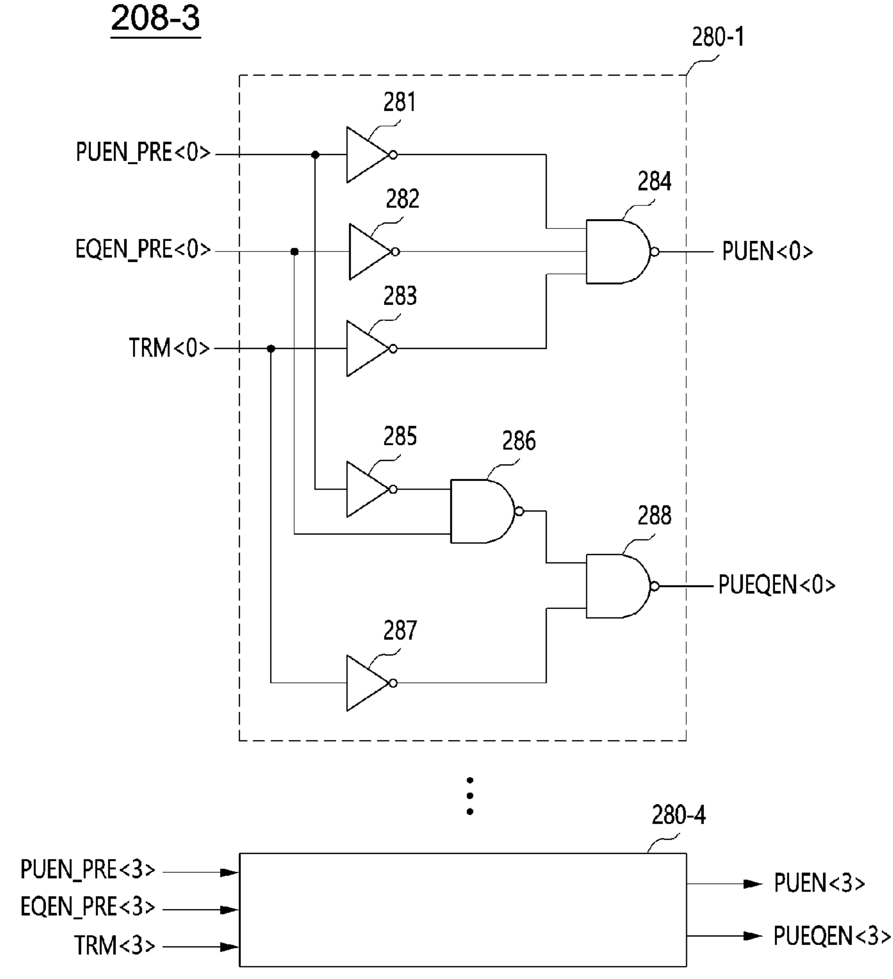
FIG. 10 is a diagram illustrating a configuration of a signal generation circuit of FIG. 9 according to an embodiment.

FIG. 10 is a diagram illustrating a configuration of the signal generation circuit 208-3 of FIG. 9 according to an embodiment.

Referring to FIG. 10, the signal generation circuit 208-3 may include a plurality of signal generation units 280-1 to 280-4. A first signal generation unit 280-1 may include a plurality of logic gates 281 to 288. A first logic gate 281 may invert and output a preliminary strength control signal PUEN_PRE<0>. A second logic gate 282 may invert and output a pre-equalization control signal EQEN_PRE<0>. A third logic gate 283 may invert and output a training mode signal TRM<0>. A fourth logic gate 284 may output a result of NAND operation on outputs of the first logic gate 281, the second logic gate 282, and the third logic gate 283 as a strength control signal PUEN<0>. A fifth logic gate 285 may invert and output a preliminary strength control signal PUEN_PRE<0>. A sixth logic gate 286 may output a result of NAN operation on an output of the fifth logic gate 285 and the pre-equalization control signal EQEN_PRE<0>. A seventh logic gate 287 may output an inverted training mode signal TRM<0>. An eighth logic gate 288 may output a result of NAND operation on outputs of the sixth logic gate 286 and the seventh logic gate 287 as an equalization control signal PUEQEN<0>. The second to fourth signal generation units 280-2 to 280-4 may be configured the same way or in a similar manner as the first signal generation unit 280-1.

The control signal generation circuit 208 described with reference to FIGS. 9 and 10 may change an operation mode of the transmission circuit 200 by adjusting the values of the plurality of preliminary strength control signals PUEN_PRE<0:M>, the plurality of pre-equalization control signals EQEN_PRE<0:M>, and the plurality of training mode control signals TRM<0:M>, as shown in a table described below and illustrated in FIG. 10.

When a preliminary strength control signal PUEN_PRE<i> (wherein 'i' is any natural number and is one of '0' to '3' in an embodiment), a pre-equalization control signal EQEN_PRE<i>, and a training mode control signal TRM<i> are all '0', a strength control signal PUEN<i> becomes '0' and an equalization control signal PUEQEN<i> becomes '0', so that a driving unit corresponding to 'i' sequence may be turned off.

When the preliminary strength control signal PUEN_PRE<i> is '1', the pre-equalization control signal EQEN_PRE<i> is '0' or '1', and the training mode control signal TRM<i> is '0', the strength control signal PUEN<i> is '1' and the equalization control signal PUEQEN<i> is '0' to enable a main driving unit corresponding to 'i' sequence to perform transmission operation.

When the preliminary strength control signal PUEN_PRE<i> is '0', the pre-equalization control signal EQEN_PRE<i> is '1', and the training mode control signal TRM<i> is '0', the strength control signal PUEN<i> is '1' and the equalization control signal PUEQEN<i> is '1' to cause an auxiliary driving unit corresponding to 'i' sequence to perform equalization operation.

When the training mode control signal TRM<i> is '1', regardless of the preliminary strength control signal PUEN_PRE<i> and the pre-equalization control signal EQEN_PRE<i>, the strength control signal PUEN<i> is '1' and the equalization control signal PUEQEN<i> is '1' to enable training operation with auxiliary driving unit corresponding to 'i' sequence. The training operation may be performed by performing data write and read in connection with an external system, monitoring data according to the read operation, and controlling equalization operation using the auxiliary driving unit using the external control signal EXT_CTRL according to the monitoring result. The equalization operation control may be performed by adjusting pulse width of an output signal of the auxiliary driving unit by adjusting the delay control signal DCTRL according to the external control signal EXT_CTRL.

Figure 11:
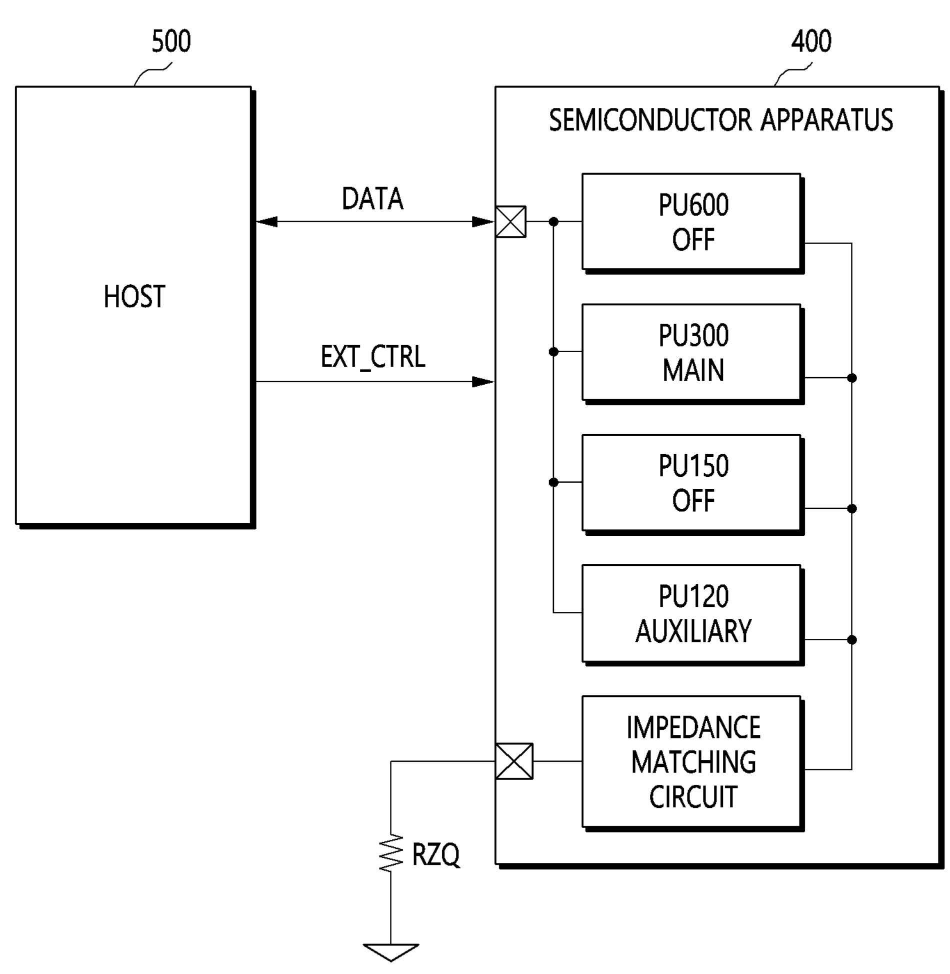
FIG. 11 is a diagram illustrating a configuration of a training system according to an embodiment.

FIG. 11 is a diagram illustrating a configuration of a training system 300 according to an embodiment.

Referring to FIG. 11, the training system 300 may include a semiconductor apparatus 400 and a host 500.

The semiconductor apparatus 400 may include a transmission circuit as described with reference to FIG. 1 or 5. The semiconductor apparatus 400 may include a plurality of driving units coupled with one or more input/output pads, such as a plurality of pull-up driving units and a plurality of pull-down driving units, and an impedance matching circuit. FIG. 11 illustrates only the plurality of pull-up driving units (PUs) among the plurality of pull-up driving units and the plurality of pull-down driving units. "PU600" is a pull-up driving unit designed to have a driving strength of 600 ohms and will be referred to as a first pull-up driving unit. "PU300" is a pull-up driving unit designed to have a driving strength of 300 ohms will be referred to as a second pull-up driving unit. "PU150" is a pull-up driving unit designed to have a driving strength of 150 ohms and will be referred to as a third pull-up driving unit. "PU120" is a pull-up driving unit designed to have a driving strength of 120 ohms and will be referred to as a fourth pull-up driving unit.

The impedance matching circuit may adjust values of the impedance adjustment signals PU_TRIM<0:N>, PD_TRIM<0:N> (see FIG. 5) based on resistance value of an external resistor RZQ coupled to an external resistance pad of the semiconductor apparatus 400 to match a predetermined driving impedance and provide them to the plurality of pull-up driving units (PUs).

The semiconductor apparatus 400 may be configured to perform a data transmission operation by selecting at least one main driving unit corresponding to a predetermined driving strength from among the plurality of driving units, and to perform an equalization operation by operating an auxiliary driving unit among the remaining driving units except the main driving unit.

The host 500 may be configured to set an operation mode of the semiconductor apparatus 400 to a training mode using the external control signal EXT_CTRL, and monitor data output through a read operation after writing data in a predetermined pattern (e.g., '11110000'), and perform a training operation by changing an auxiliary driving unit among the plurality of pull-up driving units (PUs) according to a monitoring result.

Referring to the table shown below in FIG. 11, when the driving strength is set to "LTT 150," the second pull-up driving unit PU300 of the plurality of pull-up driving units (PUs) may be set as the main driving unit M, and the remaining pull-up driving units may be used as the auxiliary driving units A. On the other hand, when the training mode is not possible, or before the training mode, the fourth pull-up driving unit PU120 may be set as a default auxiliary driving unit Adft.

When the driving strength is set to "LTT 100," the first pull-up driving unit PU600 and the second pull-up driving unit PU300 of the plurality of pull-up driving units (PU) may be set as the main driving unit M, and the remaining pull-up driving units may be used as the auxiliary driving units A. Meanwhile, the fourth pull-up driving unit PU120 may be set as the default auxiliary driving unit Adft.

When the driving strength is set to "LTT 75," the third pull-up driving unit PU150 of the plurality of pull-up driving units (PUs) may be set as the main driving unit M, and the remaining pull-up driving units may be used as the auxiliary driving units A. Meanwhile, the fourth pull-up driving unit PU120 may be set as the default auxiliary driving unit Adft.

When the driving strength is set to "LTT 50," the second pull-up driving unit PU300 and the third pull-up driving unit PU150 of the plurality of pull-up driving units (PU) may be set as the main driving unit M, and the remaining pull-up driving units may be used as the auxiliary driving units A. Meanwhile, the fourth pull-up driving unit PU120 may be set as the default auxiliary driving unit Adft.

In the training mode, for each driving strength, the remaining driving units except the main driving unit may be selected as the auxiliary driving unit alternately.

On the other hand, when the training mode is not possible, or before the training mode, the fourth pull-up driving unit PU120 may be set as the default auxiliary driving unit Adft.

The semiconductor apparatus 400 in FIG. 11 is an example of a case where the driving strength is set to "LTT 150," in which the second pull-up driving unit PU300 is set as the main driving unit to perform a data transmission operation, while the fourth pull-up driving unit PU120, which is a spare driving unit, is set as the auxiliary driving unit to perform an equalization operation.

As a result, various embodiments do not have a separate equalization circuit, and can perform equalization operation in a feed-forward manner using a spare driving unit. Thus, the quality of the transmitted signal can be improved without increasing the circuit area.

A person skilled in the art to which the present disclosure pertains will understand that the present disclosure may be carried out in other specific forms without changing its technical spirit or essential features. Therefore, it should be understood that the embodiments described above are illustrative in all aspects, not limitative. The scope of the present disclosure is defined by the claims described below rather than the detailed description, and it should be construed that the meaning and scope of the claims and all changes or modified forms derived from the equivalent concept thereof are included in the scope of the present disclosure.

What is claimed is:

1. A transmission circuit comprising a plurality of driving units coupled with an input/output pad, wherein the transmission circuit is configured to perform a data transmission operation by selecting at least one main driving unit corresponding to a predetermined driving strength from among the plurality of driving units, and configured to perform an equalization operation by selecting at least one auxiliary driving unit from among remaining driving units excluding the main driving unit.

2. The transmission circuit of claim 1, wherein the plurality of driving units includes a plurality of pull-up driving units and a plurality of pull-down driving units, and wherein the transmission circuit is configured to perform the data transmission operation by selecting the main driving unit from among each of the plurality of pull-up driving units and the plurality of pull-down driving units.

3. The transmission circuit of claim 2, wherein the transmission circuit is configured to select the auxiliary driving unit from among the plurality of pull-up driving units to perform the equalization operation.

4. The transmission circuit of claim 1, wherein the transmission circuit is configured to perform the equalization operation by changing a pulse width of data transmitted during the data transmission operation by operating the auxiliary driving unit.

5. The transmission circuit of claim 1, wherein the at least one main driving unit is configured to perform the data transmission operation when the driving strength is set to a first value, and the at least one main driving unit is configured to perform the equalization operation when the driving strength is set to a second value.

6. A transmission circuit comprising:

a data driver comprising a plurality of driving units having different driving strengths and being coupled to an input/output pad, the data driver configured to select at least one of the plurality of driving units as a main driving unit and at least one other than the at least one as an auxiliary driving unit in response to a first impedance control signal;

a driving strength and equalization control circuit configured to generate a plurality of main/auxiliary selection signals in response to a plurality of strength control signals, a plurality of equalization control signals, and input data; and a pre-driver configured to output a result of a logical combination of the plurality of main/auxiliary selection signals and a first impedance adjustment signal as the first impedance control signal.

7. The transmission circuit of claim 6, further comprising a serialization circuit configured to serialize parallel data to generate the input data, and configured to provide the input data to the driving strength and equalization control circuit.

8. The transmission circuit of claim 6, further comprising a control signal generation circuit configured to generate the plurality of strength control signals and the plurality of equalization control signals according to driving strength information and an external control signal.

9. The transmission circuit of claim 8, wherein the control signal generation circuit comprises:

an information setting circuit configured to generate a plurality of preliminary strength control signals and a plurality of pre-equalization control signals for selecting the main driving unit and the auxiliary driving unit according to the driving strength information and the external control signal; and a signal generation circuit configured to generate the plurality of strength control signals and the plurality of equalization control signals based on the plurality of preliminary strength control signals and the plurality of pre-equalization control signals.

10. The transmission circuit of claim 6, wherein the plurality of driving units include a plurality of pull-up driving units and a plurality of pull-down driving units, and wherein the data driver is configured to select the main driving unit from among each of the plurality of pull-up driving units and the plurality of pull-down driving units during a data transmission operation.

11. The transmission circuit of claim 10, wherein the data driver is configured to select the auxiliary driving unit from among the plurality of pull-up driving units during an equalization operation.

12. The transmission circuit of claim 6, wherein the data driver is configured to change a pulse width of data transmitted during a data transmission operation by operating the auxiliary driving unit during an equalization operation.

13. The transmission circuit of claim 6, wherein the driving strength and equalization control circuit comprises a plurality of sub-circuits, and wherein each of the plurality of sub-circuits is configured to generate a first signal combining the input data and one of the plurality of strength control signals, configured to delay a second signal combining the input data and one of the plurality of equalization control signals to generate a third signal, and configured to combine the first signal and the third signal to generate one of the plurality of main/auxiliary selection signals.

14. A training system comprising:

a semiconductor apparatus comprising a plurality of driving units coupled with an input/output pad, wherein the semiconductor apparatus is configured to perform a data transmission operation by selecting at least one main driving unit corresponding to a predetermined driving strength from among the plurality of driving units, and configured to perform an equalization operation by selecting at least one auxiliary driving unit from among remaining driving units excluding the main driving unit; and a host configured to write the semiconductor apparatus with write data having a predetermined pattern, and configured to perform a training operation by changing the auxiliary driving unit among the plurality of driving units according to read data.

15. The training system of claim 14, wherein the semiconductor apparatus comprises:

a data driver configured to include the plurality of driving units having different driving strengths and coupled to the input/output pad, the data driver configured to select the at least one main driving unit and the at least one auxiliary driving unit other than the at least one from among the plurality of driving units in response to a first impedance control signal;

a driving strength and equalization control circuit configured to generate a plurality of main/auxiliary selection signals in response to a plurality of strength control signals, a plurality of equalization control signals, and input data and configured to adjust a pulse width of the plurality of main/auxiliary selection signals in response to a delay control signal; and a pre-driver configured to output a result of a logical combination of the plurality of main/auxiliary selection signals and a first impedance adjustment signal as the first impedance control signal.

16. The training system of claim 15, further comprising a control signal generation circuit configured to generate the delay control signal, the plurality of strength control signals, and the plurality of equalization control signals according to driving strength information and an external control signal.

17. The training system of claim 16, wherein the control signal generation circuit comprises:

an information setting circuit configured to generate a training mode signal, a plurality of preliminary strength control signals, and a plurality of pre-equalization control signals according to the driving strength information and the external control signal; and a signal generation circuit configured to generate the plurality of strength control signals and the plurality of equalization control signals based on the training mode signal, the plurality of preliminary strength control signals, and the plurality of pre-equalization control signals.

18. The training system of claim 15, wherein the plurality of driving units includes a plurality of pull-up driving units and a plurality of pull-down driving units, and wherein the data driver is configured to select the main driving unit from among each of the plurality of pull-up driving units and the plurality of pull-down driving units during the data transmission operation.

19. The training system of claim 18, wherein the data driver is configured to select the auxiliary driving unit from among the plurality of pull-up driving units during the equalization operation.

20. The training system of claim 15, wherein the data driver is configured to change a pulse width of data transmitted during the data transmission operation by operating the auxiliary driving unit during the equalization operation.

21. The training system of claim 15, wherein the driving strength and equalization control circuit comprises a plurality of sub-circuits, and wherein each of the plurality of sub-circuits is configured to generate a first signal combining the input data and one of the plurality of strength control signals, configured to delay a second signal combining the input data and one of the plurality of equalization control signals to generate a third signal, and configured to combine the first signal and the third signal to generate one of the plurality of main/auxiliary selection signals.

* * * * *